(12) United States Patent
Nihei

(10) Patent No.: US 12,506,239 B2
(45) Date of Patent: Dec. 23, 2025

(54) DIELECTRIC FILTER

(71) Applicant: Murata Manufacturing Co., Ltd., Nagaokakyo (JP)

(72) Inventor: Takashi Nihei, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 336 days.

(21) Appl. No.: 18/367,518

(22) Filed: Sep. 13, 2023

(65) Prior Publication Data

US 2023/0420819 A1  Dec. 28, 2023

Related U.S. Application Data

(63) Continuation of application No. PCT/JP2022/004297, filed on Feb. 3, 2022.

(30) Foreign Application Priority Data

Mar. 29, 2021  (JP) ................................. 2021-055345

(51) Int. Cl.
*H01P 1/205* (2006.01)

(52) U.S. Cl.
CPC .................................. *H01P 1/2053* (2013.01)

(58) Field of Classification Search
CPC .. H01P 1/2056; H01P 1/2002; H01P 1/20345; H01P 1/2053; H01P 1/203; H01P 7/10; H01P 7/08; H01P 1/20309; H01P 1/2039; H01P 1/2088; H01P 3/16; H01P 1/205; H01P 1/2084; H01P 1/213; H01P 7/082; H01P 1/16; H01P 1/162;
(Continued)

(56) References Cited

U.S. PATENT DOCUMENTS

| 5,621,366 A | 4/1997 | Gu et al. |
| 12,051,847 B2 * | 7/2024 | Tada ..................... H01P 7/04 |

(Continued)

FOREIGN PATENT DOCUMENTS

| JP | 2000-059113 A | 2/2000 |
| JP | 2007-235465 A | 9/2007 |

(Continued)

OTHER PUBLICATIONS

Official Communication issued in International Patent Application No. PCT/JP2022/004297, mailed on Apr. 26, 2022.

*Primary Examiner* — John W Poos
(74) *Attorney, Agent, or Firm* — Keating & Bennett, LLP

(57) ABSTRACT

A filter device includes a laminate body including dielectric layers, plate electrodes, resonators, shield conductors, and a capacitive electrode. The plate electrodes are spaced apart from each other in a lamination direction in the laminate body. The resonators are between the plate electrodes and extend in a first direction. The shield conductors are on side surfaces, respectively, that are orthogonal or substantially orthogonal to the first direction in the laminate body, and connected to the plate electrodes. The resonators are provided in a second direction orthogonal or substantially orthogonal to the lamination direction and the first direction in the laminate body. The resonators each include a first end connected to the shield conductor and a second end spaced apart from the shield conductor. The capacitive electrode couples the resonators.

20 Claims, 9 Drawing Sheets

(58) Field of Classification Search
CPC ........ H01P 1/20381; H01P 3/08; H01P 11/00; H01P 7/04; H01P 1/2135; H01P 11/007; H01P 1/2138; H01P 11/003; H01P 3/06; H01P 3/081; H01P 7/06; H01P 7/105; H01P 1/20; H01P 1/2013; H01P 1/20336; H01P 1/208; H01P 1/209; H01P 11/008; H01P 3/12; H01P 5/00; H01P 5/08; H01P 7/005; H03H 1/0007; H03H 2001/0042; H03H 2001/0085; H03H 7/1766; H03H 7/0115; H03H 2007/013; H03H 7/1758; H03H 1/00; H03H 2001/0021; H03H 7/00; H03H 9/0547; H03H 9/0595; H03H 9/1035; H03H 2001/0014; H03H 2001/005; H03H 7/01; H03H 7/0161; H03H 9/02125; H03H 9/0514; H03H 9/0552; H03H 9/19; H03H 7/0123; H03H 17/06; H03H 7/0107; H03H 7/09; H03H 7/1775; H03H 9/1014; H03H 9/56; H03H 7/1791; H03H 7/38; H03H 7/461; H03H 9/02; H03H 9/0523; H03H 9/132; H03H 9/177; H03H 9/178; H03H 3/00; H03H 7/075; H03H 7/1708; H03H 7/40; H03H 7/52; H03H 7/1783; H03H 9/02133; H03H 9/02559; H03H 9/02834; H03H 9/02992; H03H 9/145; H03H 9/14544; H03H 9/64; H03H 9/6466; H03H 9/6483; H03H 9/6489; H03H 9/72; H03H 9/725; H03H 9/605; H03H 9/564; H03H 9/17; H03H 9/25; H03H 9/173; H03H 9/54; H03H 9/02157; H03H 9/02015; H03H 9/171; H03H 9/175; H03H 9/13; H03H 9/131; H03H 9/02574; H03H 9/542; H03H 9/205; H03H 9/0561

See application file for complete search history.

(56) References Cited

U.S. PATENT DOCUMENTS

| | | |
|---|---|---|
| 2001/0040490 A1 | 11/2001 | Tanaka |
| 2009/0121813 A1 | 5/2009 | Tomaki et al. |
| 2010/0141356 A1 | 6/2010 | Uhm et al. |
| 2016/0336917 A1 | 11/2016 | Cho et al. |
| 2021/0296748 A1 | 9/2021 | Ogawa |
| 2022/0052430 A1* | 2/2022 | Chou ................ H01P 1/2053 |

FOREIGN PATENT DOCUMENTS

| | | |
|---|---|---|
| JP | 2009-124212 A | 6/2009 |
| JP | 2010-141877 A | 6/2010 |
| JP | 2016-220190 A | 12/2016 |
| WO | 2020/026889 A1 | 2/2020 |

* cited by examiner

DIELECTRIC FILTER

CROSS REFERENCE TO RELATED APPLICATIONS

This application claims the benefit of priority to Japanese Patent Application No. 2021-055345 filed on Mar. 29, 2021 and is a Continuation Application of PCT Application No. PCT/JP2022/004297 filed on Feb. 3, 2022. The entire contents of each application are hereby incorporated herein by reference.

BACKGROUND OF THE INVENTION

1. Field of the Invention

The present disclosure relates to a dielectric filter, and, more particularly, to a technology to improve filter characteristics of a dielectric filter.

2. Description of the Related Art

Japanese Patent Laid-Open No. 2007-235465 discloses a band-pass filter using a multilayer dielectric resonator that includes multiple internal electrode layers stacked in a dielectric. In the band-pass filter disclosed in Japanese Patent Laying-Open No. 2007-235465, the inductive portion of the internal electrode layer is configured in a longitudinal pattern whose portion has a tapered width. This configuration allows reduction of the resonance frequency, without reducing Q value. As a result, size reduction of the resonator can be achieved.

In a band-pass filter adopting a multilayer dielectric resonator as disclosed in Japanese Patent Laying-Open No. 2007-235465, the frequency of an attenuation pole is determined by an extent of coupling of resonators. In general, attenuation poles are produced on both the higher-frequency side and the lower-frequency side than a desired passband, and a desired passband width and attenuation characteristics are achieved by adjusting the frequency of each attenuation pole.

However, for example, due to constraints on the layout in the dielectric substrate, sufficient coupling of the resonators may not be obtained and the frequencies of the attenuation poles may overlap. In this case, desired attenuation characteristics may not be achieved.

SUMMARY OF THE INVENTION

Preferred embodiments of the present invention provide dielectric filters each with improved attenuation characteristics.

A dielectric filter according to a preferred embodiment of the present invention includes a laminate body having a cuboid or a substantially cuboid shape, a first plate electrode and a second plate electrode, a first resonator, a second resonator, and a third resonator, a first shield conductor and a second shield conductor, and a first capacitive electrode. The laminate body includes a plurality of dielectric layers. The first plate electrode and the second plate electrode are provided within the laminate body, and spaced apart from each other in a lamination direction. The first to third resonators are between the first plate electrode and the second plate electrode and extend in a first direction orthogonal or substantially orthogonal to the lamination direction. The first shield conductor and the second shield conductor are provided, in the laminate body, on a first side surface and a second side surface, respectively, that are orthogonal or substantially orthogonal to the first direction, and are connected to the first plate electrode and the second plate electrode. The first to third resonators are provided within the laminate body and aligned in a second direction orthogonal or substantially orthogonal to the lamination direction and the first direction in order of the first resonator, the second resonator, and the third resonator. The first resonator, the second resonator, and the third resonator each include a first end connected to the first shield conductor and a second end spaced apart from the second shield conductor. The first capacitive electrode couples the first resonator and the third resonator.

With each of the dielectric filters according to preferred embodiments of the present invention, the first capacitive electrode to couple the first resonator and the third resonator is configured such that the first resonator, the second resonator, and the third resonator are provided in the stated order from the input terminal to the output terminal. The first capacitive electrode allows individual adjustment of cross-coupling between two resonators that are not adjacent. This is able to expand the adjustment range of frequency for multiple attenuation poles, thus improving attenuation characteristics of the dielectric filters.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
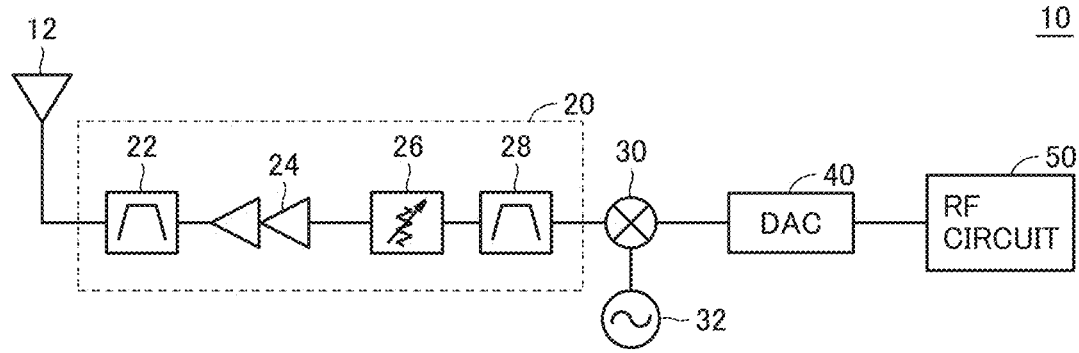
FIG. 1 is a block diagram of a communication device including a radio frequency front-end circuit including a filter device according to a preferred embodiment of the present invention.

Hereinafter, preferred embodiments of the present invention will be described, with reference to the accompanying drawings. The same reference signs are used to denote the same or corresponding portions in the drawings, and the description thereof will not be repeated.

Preferred Embodiments

Basic Configuration of Communication Device

FIG. 1 is a block diagram of a communication device 10 including a radio frequency front-end circuit 20 including a filter device according to a preferred embodiment of the present invention. The communication device 10 is, for example, a mobile terminal represented by a smartphone, or a cellular base station.

Referring to FIG. 1, the communication device 10 includes an antenna 12, a radio frequency front-end circuit 20, a mixer 30, a local oscillator 32, a digital-to-analog converter (DAC) 40, and an RF circuit 50. The radio frequency front-end circuit 20 includes band-pass filters 22 and 28, an amplifier 24, and an attenuator 26. While FIG. 1 illustrates the radio frequency front-end circuit 20 as including a transmitter circuit that transmits a radio-frequency signal through the antenna 12, the radio frequency front-end circuit 20 may include, for example, a receiver circuit that receives a radio-frequency signal via the antenna 12.

The communication device 10 upconverts a signal, transmitted from the RF circuit 50, into a radio-frequency signal and emits the radio-frequency signal through the antenna 12. The modulated digital signal, output from the RF circuit 50, is converted into an analog signal by the digital-to-analog converter 40. The mixer 30 mixes the analog signal, converted from the digital signal by the digital-to-analog converter 40, with an oscillating signal from the local oscillator 32, and upconverts the mixed signal into a radio-frequency signal. The band-pass filter 28 filters out undesired waves caused by the upconversion and extracts only a signal that is in a desired frequency band. The attenuator 26 adjusts the strength of the signal. The amplifier 24 power-amplifies the signal having passed through the attenuator 26, to a predetermined level. The band-pass filter 22 filters out, from the signal, undesired waves caused during the amplification process, and passes therethrough only a signal component that is in a frequency band defined by the communication standards. The signal having passed through the band-pass filter 22 is emitted as a transmission signal through the antenna 12.

A filter device according to a preferred embodiment of the present invention can be used as the band-pass filters 22 and 28 included in the communication device 10 as described above.

Configuration of Filter Device

Figure 2:
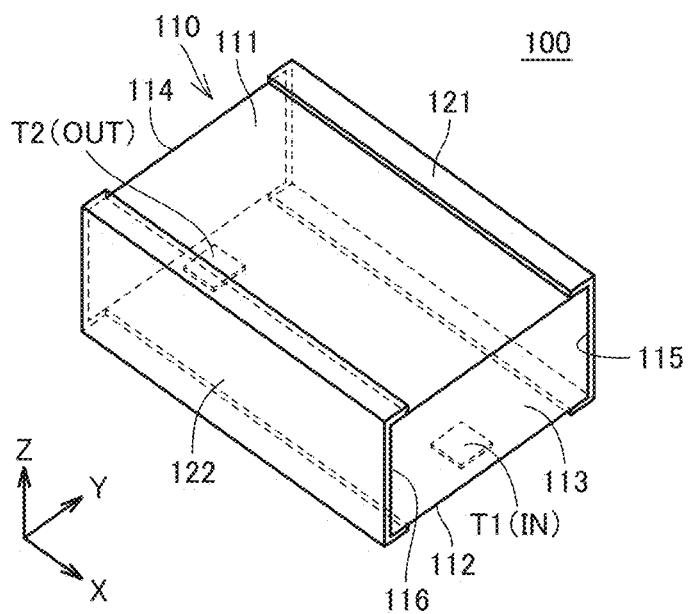
FIG. 2 is an external perspective view of a filter device according to a preferred embodiment of the present invention.
Figure 3:
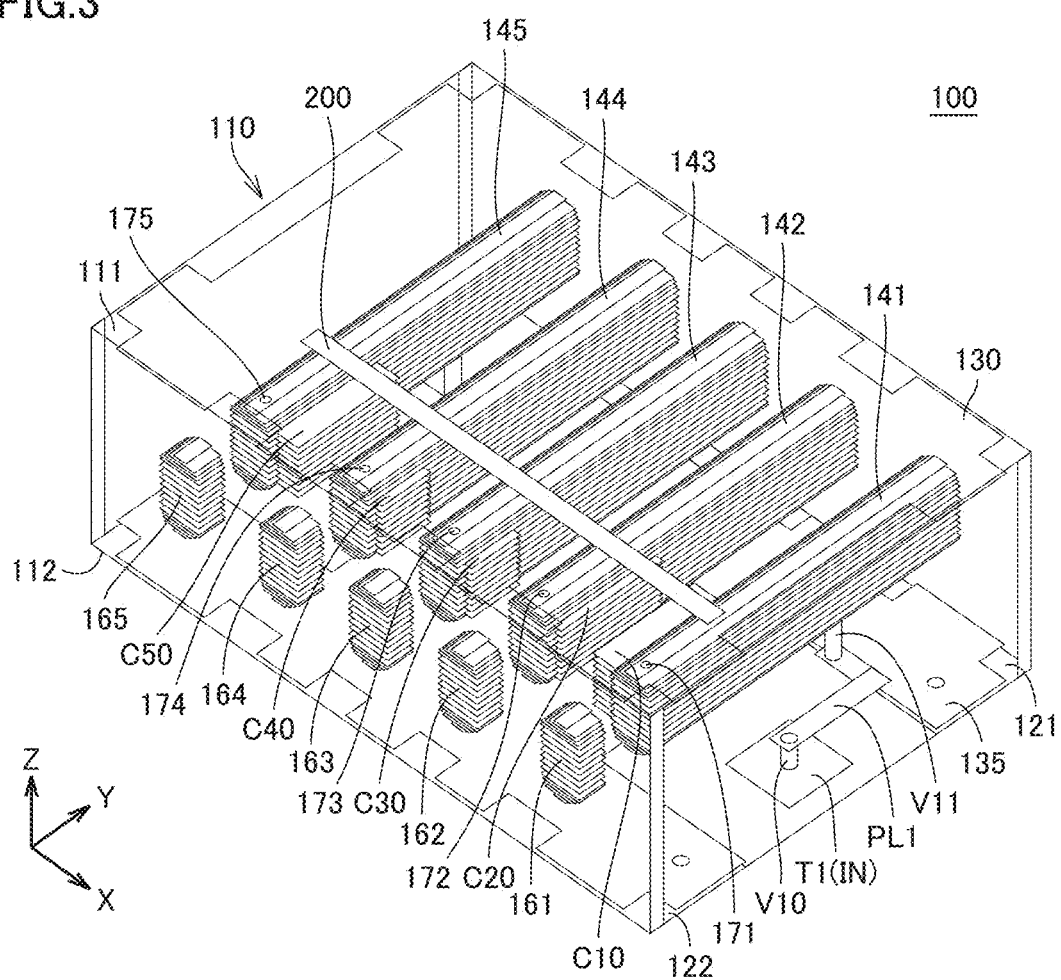
FIG. 3 is a see-through perspective view showing an internal structure of a filter device according to a preferred embodiment of the present invention.

Next, referring to FIGS. 2 and 3, a specific configuration of the filter device 100 according to a preferred embodiment is now described. The filter device 100 is a dielectric filter including multiple resonators that are distributed elements.

FIG. 2 is an external perspective view of the filter device 100. FIG. 2 only shows a configuration that can be seen from the outer surface of the filter device 100, and the internal configuration is omitted. FIG. 3, in contrast, is a see-through perspective view showing an internal structure of the filter device 100.

Referring to FIG. 2, the filter device 100 includes a laminate body 110 having a cuboid or substantially cuboid shape in which multiple dielectric layers are laminated in a lamination direction. The laminate body 110 includes an upper surface 111, a lower surface 112, a side surface 113, a side surface 114, a side surface 115, and a side surface 116. The side surface 113 is a side surface in the positive direction of X axis. The side surface 114 is a side surface in the negative direction of X axis. The side surfaces 115 and 116 are side surfaces orthogonal or substantially orthogonal to Y-axis direction.

For example, each dielectric layer included in the laminate body 110 is made of ceramics such as a low temperature co-fired ceramics (LTCC), or a resin. Within the laminate body 110, the distributed elements including the resonators, and capacitors and inductors to couple the distributed elements include multiple plate conductors provided on each dielectric layer and multiple vias provided between the dielectric layers. The "via," as used herein, refers to a conductor that connects the conductors included in different dielectric layers and extends in the lamination direction. For example, the via is defined by a conductive paste, plating, and/or a metal pin.

In the following description, the lamination direction for the laminate body 110 will be referred to as "Z-axis direction," a direction orthogonal or substantially orthogonal to Z-axis direction and along a long side of the laminate body 110 will be referred to as "X-axis direction" (a second direction), and a direction along a short side of the laminate body 110 will be referred to as "Y-axis direction" (a first direction). Moreover, in the following, the positive direction of Z-axis in the drawings may be referred to as the upper side of the figures and the negative direction of Z-axis in the figures may be referred to as the lower side of the figures.

As shown in FIG. 2, the filter device 100 includes shield conductors 121 and 122 covering the side surfaces 115 and 116 of the laminate body 110. The shield conductors 121 and 122 each have a C shape or substantially a C shape, as viewed from X-axis direction of the laminate body 110. In other words, the shield conductors 121 and 122 cover portions of the upper surface 111 and the lower surface 112 of the laminate body 110. Portions of the shield conductors 121 and 122 that are disposed on the lower surface 112 of the laminate body 110 are connected to a ground electrode on a mounting substrate (not shown) by a connection member such as a solder bump, for example. In other words, the shield conductors 121 and 122 also define and function as ground terminals.

The filter device 100 includes an input terminal T1 and an output terminal T2, which are disposed on the lower surface 112 of the laminate body 110. The input terminal T1 is disposed on the lower surface 112, closer to the side surface 113 in the positive direction of X axis. The output terminal T2, in contrast, is disposed on the lower surface 112, closer to the side surface 114 in the negative direction of X axis. The input terminal T1 and the output terminal T2 are connected to corresponding electrodes on the mounting substrate by connection members such as solder bumps, for example.

Next, referring to FIG. 3, the internal structure of the filter device 100 is now described. In addition to the configuration shown in FIG. 2, the filter device 100 further includes plate electrodes 130 and 135, resonators 141, 142, 143, 144, and 145, capacitor electrodes 161, 162, 163, 164, and 165, connection conductors 171, 172, 173, 174, and 175, and a capacitive electrode 200. In the following description, the resonators 141 to 145, the capacitor electrodes 161 to 165, and the connection conductors 171 to 175 may be comprehensively referred to as a "resonator 140," a "capacitor electrode 160," and a "connection conductor 170," respectively.

The plate electrodes 130 and 135 are disposed oppositely within the laminate body 110, and spaced apart from each other in the lamination direction (Z-axis direction). The plate electrode 130 is disposed on the dielectric layer that is closer to the upper surface 111. Ends of the plate electrode 130 along X axis are connected to the shield conductors 121 and 122. The plate electrode 130 is structure to cover or substantially cover the dielectric layers, as viewed in plan from the lamination direction.

The plate electrode 135 is disposed on the dielectric layer that is closer to the lower surface 112. As viewed in plan from the lamination direction, the plate electrode 135 has an H shape or substantially an H shape in which notches are provided opposite to the input terminal T1 and the output terminal T2. Ends of the plate electrode 135 along X axis are connected to the shield conductors 121 and 122.

In the laminate body 110, the resonators 141 to 145 are disposed between the plate electrode 130 and the plate electrode 135. The resonators 141 to 145 extend in Y-axis direction. Each end (a first end) of each of the resonators 141 to 145 in the positive direction of Y axis is connected to the shield conductor 121. Each end (a second end) of each of the resonators 141 to 145 in the negative direction of Y axis, in contrast, is spaced apart from the shield conductor 122.

In the filter device 100, the resonators 141 to 145 are aligned in X-axis direction within the laminate body 110. More specifically, the resonators 141, 142, 143, 144, and 145 are disposed in the stated order from the positive direction of X axis to the negative direction of X axis.

Figure 4:
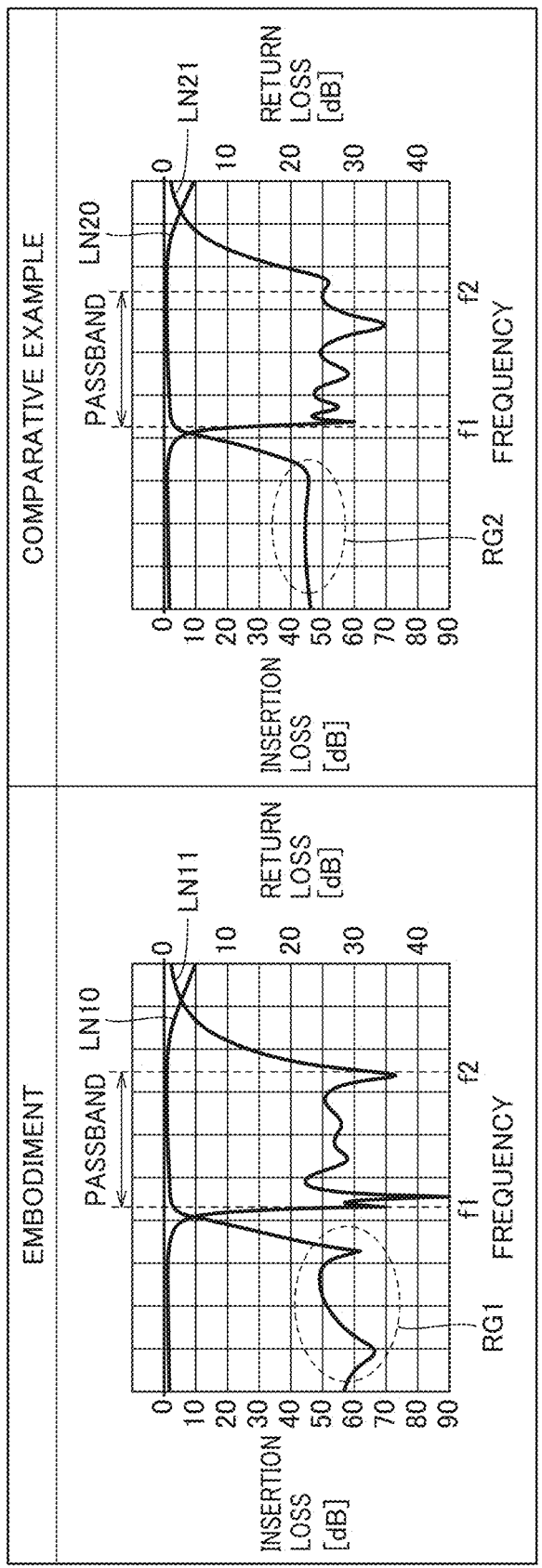
FIG. 4 is a diagram for illustrating bandpass characteristics of a filter device according to a preferred embodiment of the present invention.

The resonators 141 to 145 each include multiple conductors disposed along the lamination direction. As shown in FIG. 4, in a cross section parallel or substantially parallel to Z-X plane of each resonator 140 (i.e., a cross section as viewed in plan from Y-axis direction), the conductors, as a whole, have an oval or substantially an oval shape. Stated differently, among the conductors, dimensions (first widths) in X-axis direction of the uppermost and lowermost conductors are narrower than a dimension (a second width) in X-axis direction of a middle conductor.

In the resonator 140, the conductors defining each resonator are electrically connected to the connection conductor 170 near the second end. In each resonator, the distance between the first end (i.e., the shield conductor 121) and the second end is designed to have approximately $\lambda/4$, where $\lambda$ is the wavelength of a radio-frequency signal carried by the resonator.

The resonator 140 defines and functions as a distributed-element TEM mode resonator, which includes multiple conductors as middle conductors and the plate electrodes 130 and 135 as outer conductors.

The resonator 141 is connected to the input terminal T1 by vias V10 and V11 and a plate electrode PL1. The resonator 145 is connected to the output terminal T2 by vias and a plate electrode, which is hidden from view by the resonator in FIG. 3. The resonators 141 to 145 are magnetically coupled. The radio-frequency signal input to the input terminal T1 is transmitted to the resonators 141 to 145 in the stated order and output from the output terminal T2, at which time, the filter device 100 functions as a band-pass filter, depending on an extent of coupling of the resonators.

On the second end side of the resonator 140, a projecting capacitor electrode is disposed between adjacent resonators. The capacitor electrode is an overhung portion of the conductors defining the resonator. An extent of capacitive coupling of adjacent resonators can be adjusted by adjusting the length of the capacitor electrode in Y-axis direction, the distance of the capacitor electrode to an adjacent resonator, and/or the number of conductors comprising the capacitor electrode.

In the filter device 100, a capacitor electrode C10 is projects from the resonator 141 toward the resonator 142, and a capacitor electrode C20 projects from the resonator 142 toward the resonator 141, as shown in FIG. 3. Moreover, a capacitor electrode C30 projects from the resonator 143 toward the resonator 142, and a capacitor electrode C40 projects from the resonator 144 toward the resonator 143. Furthermore, a capacitor electrode C50 projects from the resonator 145 toward the resonator 144.

The capacitor electrodes C10 to C50 are not necessary. Some or all of the capacitor electrodes may not be provided if a desired extent of coupling is achieved between the resonators. In addition of the configuration of FIG. 3, the filter device may include a capacitor electrode projecting from the resonator 142 toward the resonator 143, a capacitor electrode projecting from the resonator 143 toward the resonator 144, and a capacitor electrode projecting from the resonator 144 toward the resonator 145.

In the filter device 100, a capacitor electrode 160 is also disposed opposite to the second end of the resonator 140. A cross section of the capacitor electrode 160 parallel or substantially parallel to Z-X plane is the same as or similar to the cross section of the resonator 140. The capacitor electrode 160 is connected to the shield conductor 122. This allows a capacitor to be defined by the resonator 140 and a corresponding capacitor electrode 160. The capacitance of the capacitor defined by the resonator 140 and the corresponding capacitor electrode 160 can be adjusted by adjusting a gap (a distance in Y-axis direction) between corresponding resonator and capacitor electrode.

Moreover, in the filter device 100, the capacitive electrode 200 having a plate shape is disposed on the dielectric layer closer to the upper surface 111 side than the resonator 140, the capacitive electrode 200 extending above the resonator 141 and the resonator 145 in X-axis direction from the resonator 141 to the resonator 145. Capacitive coupling is produced between the resonator 141 and the resonator 145 by the capacitive electrode 200.

In a filter including a dielectric resonator, similar to the filter device 100, the frequency of the attenuation pole is determined by an extent of coupling of resonators. Specifically, in the coupling of the resonators, if inductive coupling has an advantage, an attenuation pole is produced on the higher-frequency side than the passband. If capacitive coupling has an advantage, an attenuation pole is produced on the lower-frequency side than the passband.

In adjacent resonators, an extent of coupling of the resonators can be adjusted by changing the distance or the area of the resonators using the capacitor electrodes C10 through C50. However, for the resonators that are not adjacent, sufficient coupling of the resonators may not be obtained by the capacitor electrodes C10 through C50. In this case, the frequencies of attenuation poles are close to overlapping, and desired attenuation characteristics may not be achieved.

In the filter device 100 according to the present preferred embodiment, in contrast, the resonator 141 and the resonator 145 are coupled by the capacitive electrode 200, as described above. This allows improvement of the cross-coupling between the resonator 141 and the resonator 145. Accordingly, the frequencies of the attenuation poles produced by the resonator 141 and the resonator 145 can be adjusted individually, allowing desired attenuation characteristics to be achieved. Positioning the capacitive electrode 200 closer to the first end side (the shield conductor 121 side) increases the inductive coupling of the resonators, and positioning the capacitive electrode 200 closer to the second end side (the shield conductor 122 side) increases the capacitive coupling of the resonators.

Bandpass Characteristics of Filter Device

FIG. 4 is a diagram for illustrating bandpass characteristics of a filter device according to Comparative Example and the filter device 100 according to the present preferred embodiment. The filter device according to Comparative Example is the same or substantially the same as the filter device 100, except for not including the capacitive electrode 200. In each graph shown in FIG. 4, the frequency is indicated on the horizontal axis, and the insertion loss (lines LN10 and LN20) and the return loss (lines LN11 and LN21) are indicated on the vertical axis. In the example of FIG. 4, a target passband is in the range from f1 to f2.

Referring to FIG. 4, in the filter device according to Comparative Example, attenuation poles overlap in a region RG2 that is closer to the lower-frequency side than the passband, and the locations of the attenuation poles are thus poorly recognizable. Due to this, the attenuations (the insertion losses) in the region RG2 is constant or substantially constant near or at about 45 dB, for example.

In the filter device 100 according to the present preferred embodiment, in contrast, two attenuation poles are produced as can be seen in a region RG1. Thus, attenuations greater than about 60 dB, for example, are achieved at each attenuation pole.

While the filter device 100 has been described with reference to the improvement of the cross-coupling between the resonator 141 connected to the input terminal T1 and the resonator 145 connected to the output terminal T2, the cross-coupling may be improved between other resonators, for example, between the resonator 142 and the resonator 144, and/or between the resonator 143 and the resonator 145.

While the present preferred embodiment has been described with reference to the filter device including five resonators, the present invention is applicable to a filter device that has at least three resonators.

The "resonators 141, 142, 143, 144, and 145" according to the present preferred embodiment correspond to a "first resonator," a "fourth resonator," a "second resonator," a "fifth resonator," and a "third resonator," respectively, according to the present disclosure. The "plate electrode 130" and the "plate electrode 135" according to the present preferred embodiment correspond to a "first plate electrode" and a "second plate electrode," respectively, according to the present disclosure. The "side surface 115" and the "side surface 116" according to the present preferred embodiment correspond to a "first side surface" and a "second side surface," respectively, according to the present disclosure. The "shield conductor 121" and the "shield conductor 122" according to the present preferred embodiment correspond to a "first shield conductor" and a "second shield conductor," respectively, according to the present disclosure. "Y-axis direction" and "X-axis direction" according to the present preferred embodiment correspond to a "first direction" and a "second direction," respectively, according to the present disclosure. The "connection conductor 170 (171 to 175)" according to the present preferred embodiment correspond to a "second connection conductor" according to the present disclosure.

Variations

Referring to FIGS. 5 to 10, variations of the capacitive electrode according to preferred embodiments of the present invention to improving the cross-coupling between the resonators are now described. In the following variations, the descriptions of the elements overlapping with those included in the filter device 100 of FIG. 2 are not repeated.

Variation 1

Figure 5:
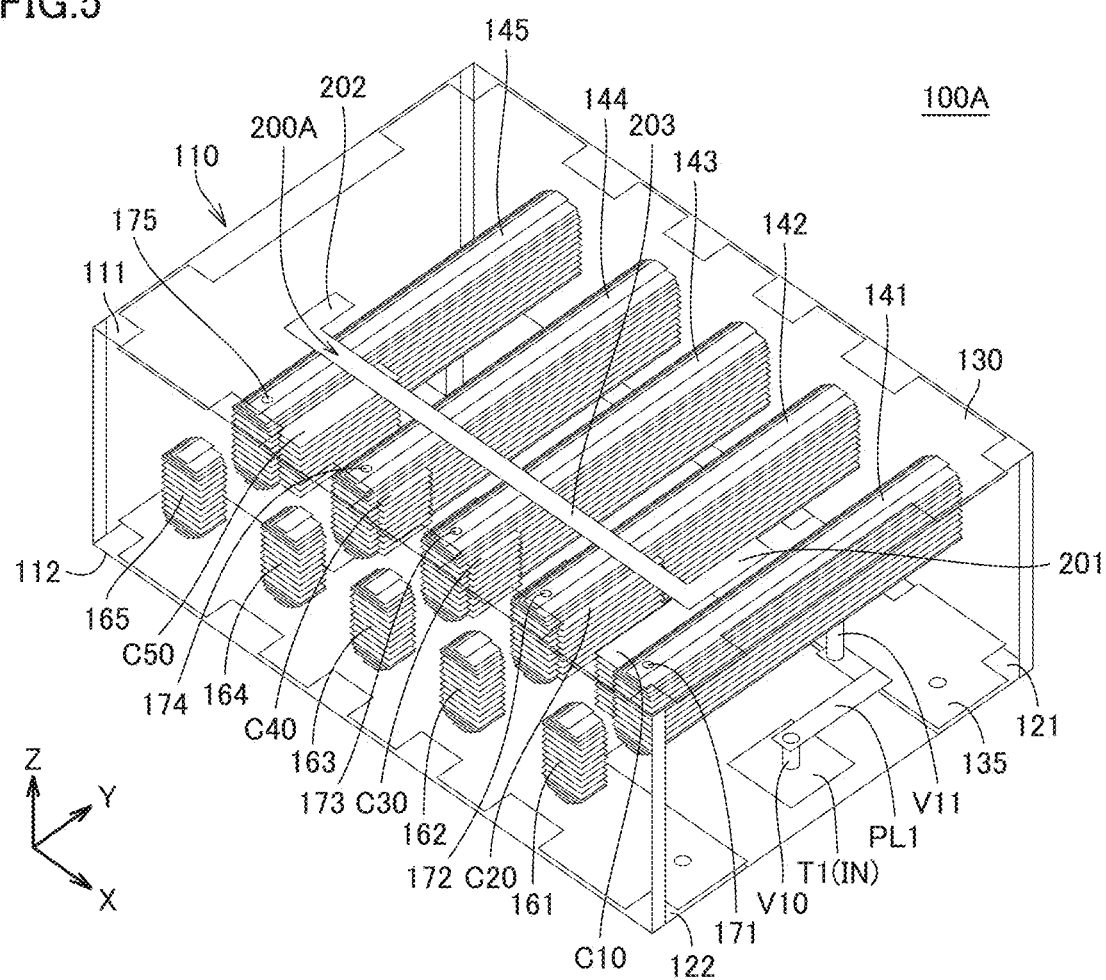
FIG. 5 is a see-through perspective view showing an internal structure of a filter device according to Variation 1 of a preferred embodiment of the present invention.

FIG. 5 is a see-through perspective view showing an internal structure of a filter device 100A according to Variation 1 of a preferred embodiment of the present invention. The filter device 100A includes a capacitive electrode 200A replacing the capacitive electrode 200 included in the filter device 100 of FIG. 2.

The capacitive electrode 200A, schematically, corresponds to the capacitive electrode 200 included in the filter device 100 that further includes projections projecting from the ends. More specifically, the capacitive electrode 200A includes a first portion 201, a second portion 202, and a third portion 203.

The first portion 201 is a plate electrode opposing the resonator 141 in the lamination direction and extending in Y-axis direction. The second portion 202 is a plate electrode opposing the resonator 145 in the lamination direction and extending in Y-axis direction. The third portion 203 is a plate electrode extending in X-axis direction and connecting the first portion 201 and the second portion 202.

An extent of coupling of the first portion 201 and the resonator 141 and an extent of coupling of the second portion 202 and the resonator 145 can be adjusted by adjusting the lengths of the first portion 201 and the second portion 202 in Y-axis direction.

In the capacitive electrode 200 of FIG. 3 as viewed in plan view in the lamination direction, the capacitive electrode 200 also crosses the resonators 142 to 144. Consequently, the coupling can occur not only between the resonator 141 and the resonator 145, but some coupling can also occur between other resonators. In contrast, in the configuration of the capacitive electrode 200A according to Variation 1, the first portion 201 and the second portion 202 can improve an extent of the coupling between the capacitive electrode 200A and the resonator 141 and the resonator 145 greater than an extent of coupling between the capacitive electrode 200A and other resonators.

As described above, the capacitive electrode 200A according to Variation 1 allows fine adjustment of the extent of cross-coupling. This can facilitate the adjustment of the frequency of each attenuation pole, and also increase the attenuation pole settings accuracy, allowing desired attenuation characteristics to be readily achievable.

Variation 2

Figure 6:
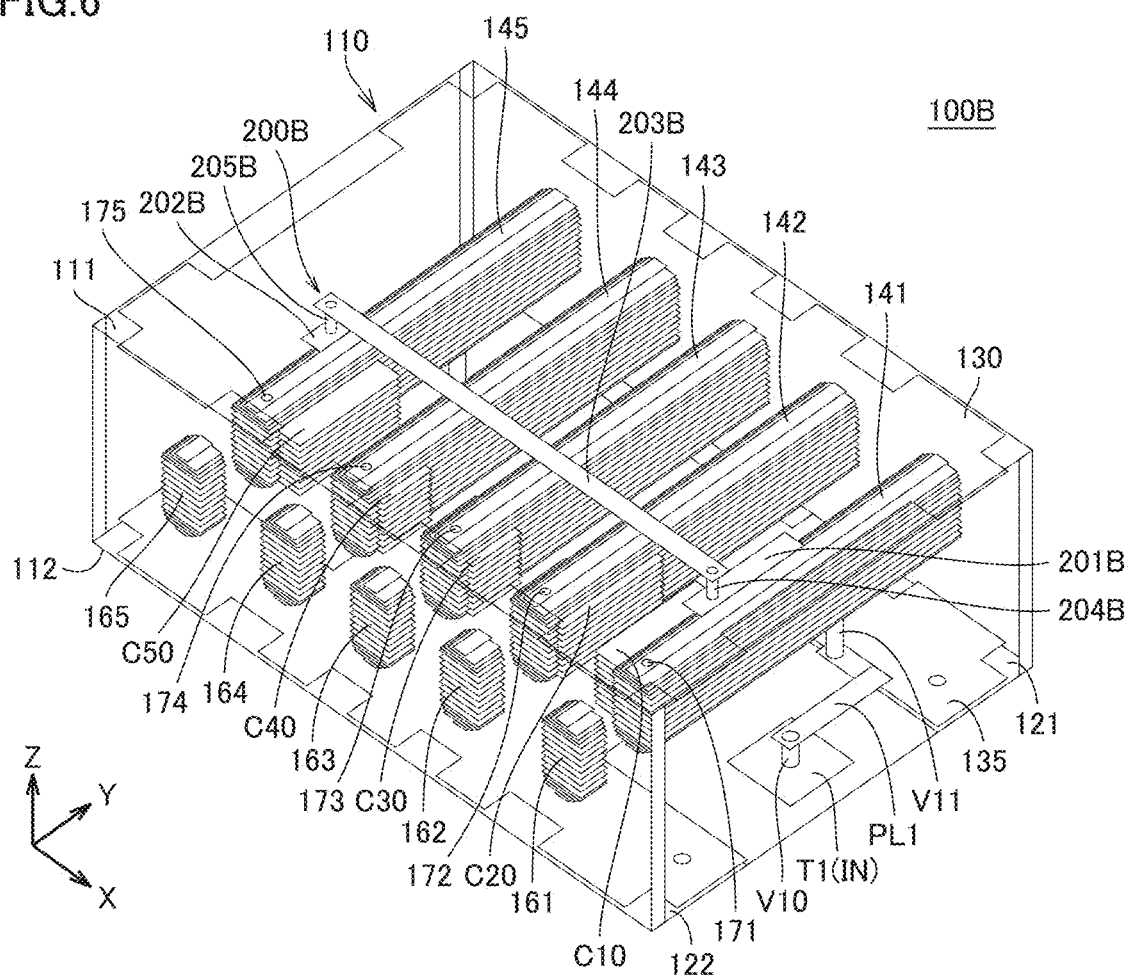
FIG. 6 is a see-through perspective view showing an internal structure of a filter device according to Variation 2 of a preferred embodiment of the present invention.

FIG. 6 is a see-through perspective view showing an internal structure of the filter device 100B according to Variation 2 of a preferred embodiment of the present invention. The filter device 100B includes a capacitive electrode 200B replacing the capacitive electrode 200 included in the filter device 100 of FIG. 2.

The capacitive electrode 200B according to Variation 2, schematically, includes a capacitive electrode 200A according to Variation 1 of FIG. 5 having a first portion 201, a second portion 202, and a third portion 203 connected together by vias.

More specifically, the capacitive electrode 200B includes a first portion 201B, a second portion 202B, a third portion 203B, and vias 204B and 205B. The first portion 201B is a plate electrode opposed to the resonator 141 in the lamination direction and extending in Y-axis direction. The second portion 202B is a plate electrode opposed to the resonator 145 in the lamination direction and extending in Y-axis direction. The third portion 203B is a plate electrode extending in X-axis direction.

In the capacitive electrode 200B, the third portion 203B is disposed on the dielectric layer on the upper surface 111 side than the first portion 201B and the second portion 202B. The end of the third portion 203B in the positive direction of X axis is connected to the first portion 201B by the via 204B. The end of the third portion 203B in the negative direction of X axis is connected to the second portion 202B by the via 205B.

With this configuration, the coupling of the resonator 141 and the resonator 145 can be improved as with the preferred embodiment described above and Variation 1. Furthermore, in the capacitive electrode 200B, the distances in the lamination direction between the resonators 142 to 144 and the third portion 203B are large, as compared to the capacitive electrode 200 according to the preferred embodiment and the capacitive electrode 200A according to Variation 1. Thus, the impact of the capacitive electrode 200B on the resonators 142 to 144 can be reduced. In other words, only intended resonators can be adjusted individually. Consequently, the attenuation pole setting accuracy can be further increased. Accordingly, desired attenuation characteristics are readily achievable.

The "via 204B" and the "via 205B" according to Variation 2 correspond to a "first via electrode" and a "second via electrode," respectively, according to the present disclosure.

Variation 3

Figure 7:
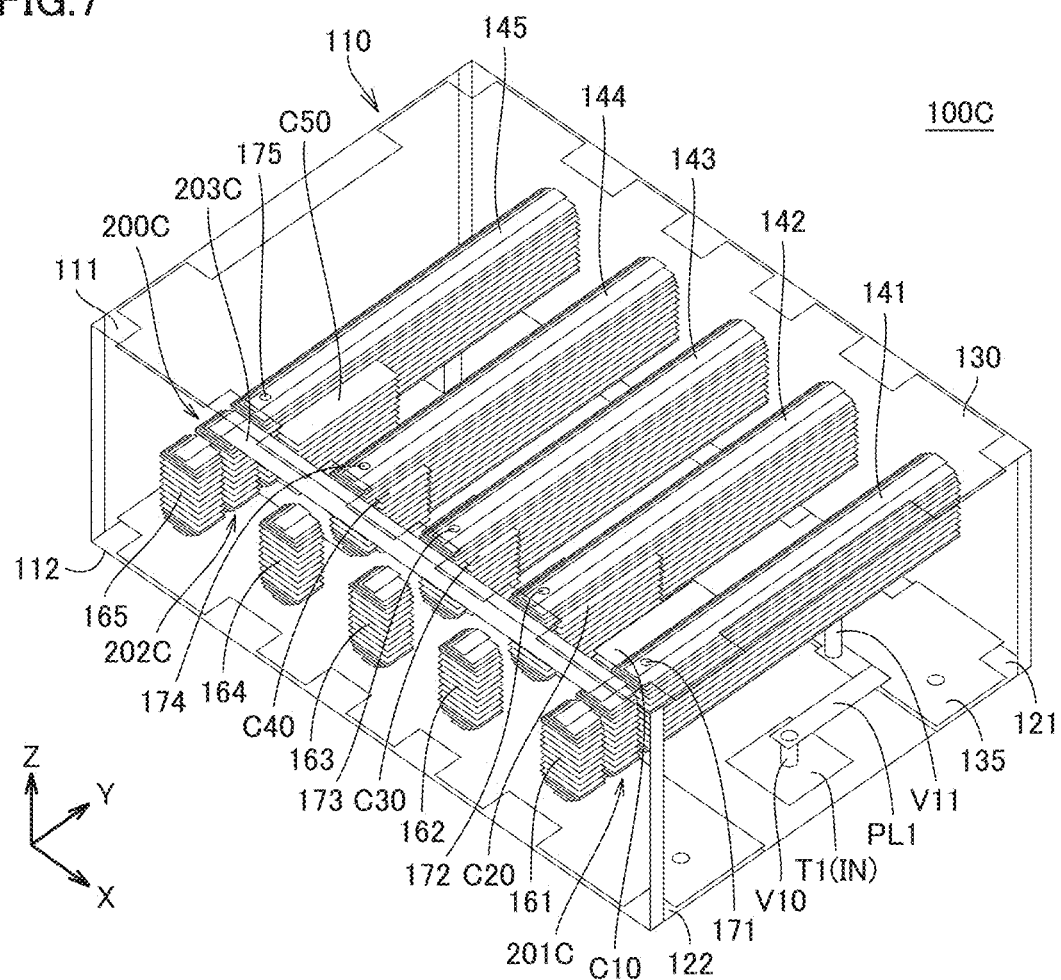
FIG. 7 is a see-through perspective view showing an internal structure of a filter device according to Variation 3 of a preferred embodiment of the present invention.

FIG. 7 is a see-through perspective view showing an internal structure of a filter device 100C according to Variation 3 of a preferred embodiment of the present invention. The filter device 100C includes a capacitive electrode 200C replacing the capacitive electrode 200 included in the filter device 100 of FIG. 2.

The capacitive electrodes 200, 200A, and 200B according to the preferred embodiment described above and Variations 1 and 2 are coupled with the resonators 141 and 145 in the lamination direction (Z-axis direction). In contrast, the capacitive electrode 200C included in the filter device 100C of Variation 3 is coupled with resonators 141 and 145 in the extension direction (Y-axis direction) of the resonators 141 and 145.

More specifically, the capacitive electrode 200C includes a fourth portion 201C disposed opposite to the second end side of the resonator 141, a fifth portion 202C disposed opposite to the second end side of the resonator 145, and a sixth portion 203C connecting the fourth portion 201C and the fifth portion 202C. The fourth portion 201C and the fifth portion 202C, as viewed in plan in Y-axis direction, have the same or similar shapes to corresponding resonator and capacitor electrode, and are disposed between these resonator and capacitor electrode. An extent of coupling with a corresponding resonator is adjusted by adjusting the distances between the fourth portion 201C and the fifth portion 202C and corresponding resonators, the dimensions of the fourth portion 201C and the fifth portion 202C in Y-axis direction, and/or the number of conductors included in the fourth portion 201C and the fifth portion 202C.

The sixth portion 203C is a plate electrode extending in X-axis direction, and connecting a conductor on the upper surface 111 side in the fourth portion 201C and a conductor on the upper surface 111 side in the fifth portion 202C. This improves the coupling of the resonator 141 and the resonator 145 via the capacitive electrode 200C.

This configuration also improves the cross-coupling of the resonator 141 and the resonator 145, thus allowing individual adjustment of the frequency of an attenuation pole that is produced by the resonator 141 and the resonator 145. Accordingly, desired attenuation characteristics can be achieved.

Variation 4

The preferred embodiment described above and Variations 1 through 3 have been described with respect to the configuration to improve the cross-coupling of the resonator 141 and the resonator 145 by the capacitive electrode. Variation 4 of a preferred embodiment of the present invention is now described with respect to a configuration to further improve, in addition to the cross-coupling of the resonator 141 and the resonator 145, the cross-coupling of other resonators.

Figure 8:
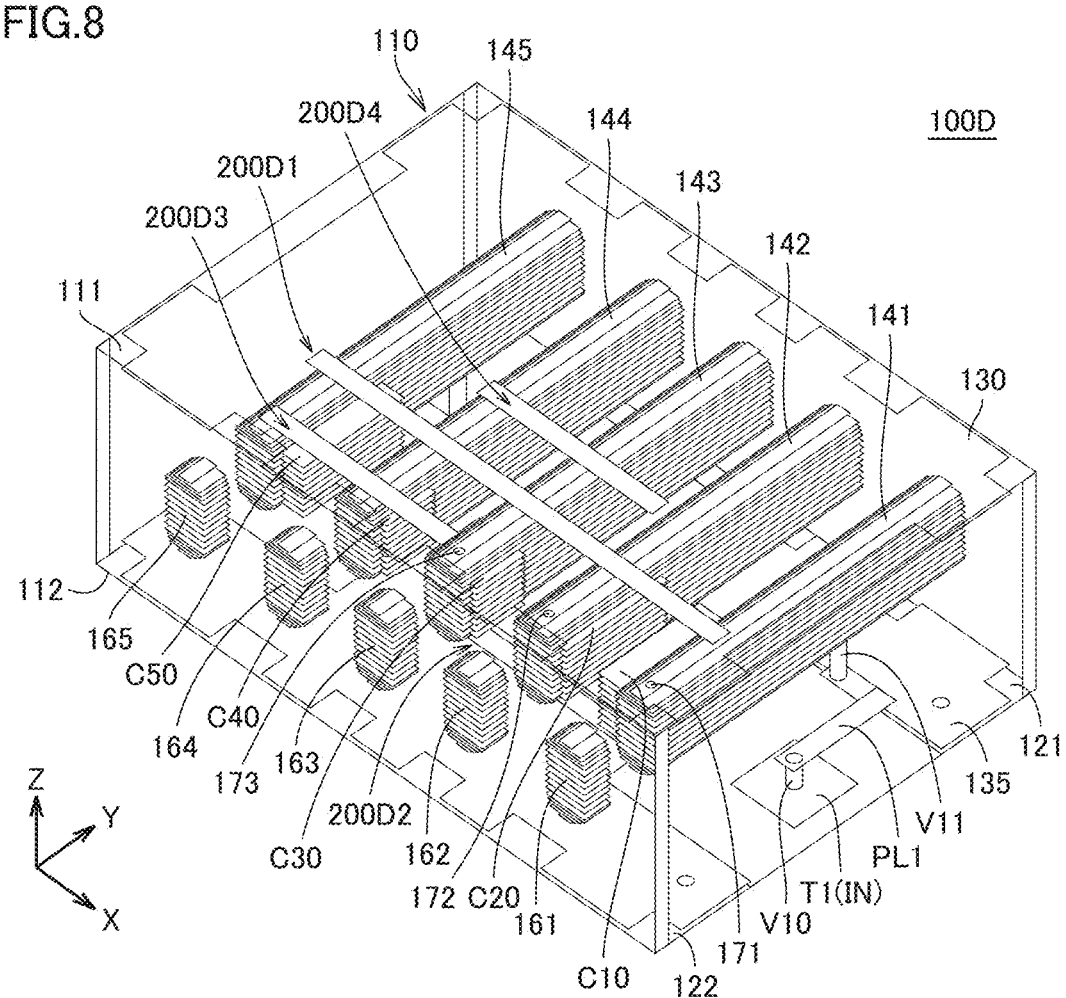
FIG. 8 is a see-through perspective view showing an internal structure of a filter device according to Variation 4 of a preferred embodiment of the present invention.
Figure 9:
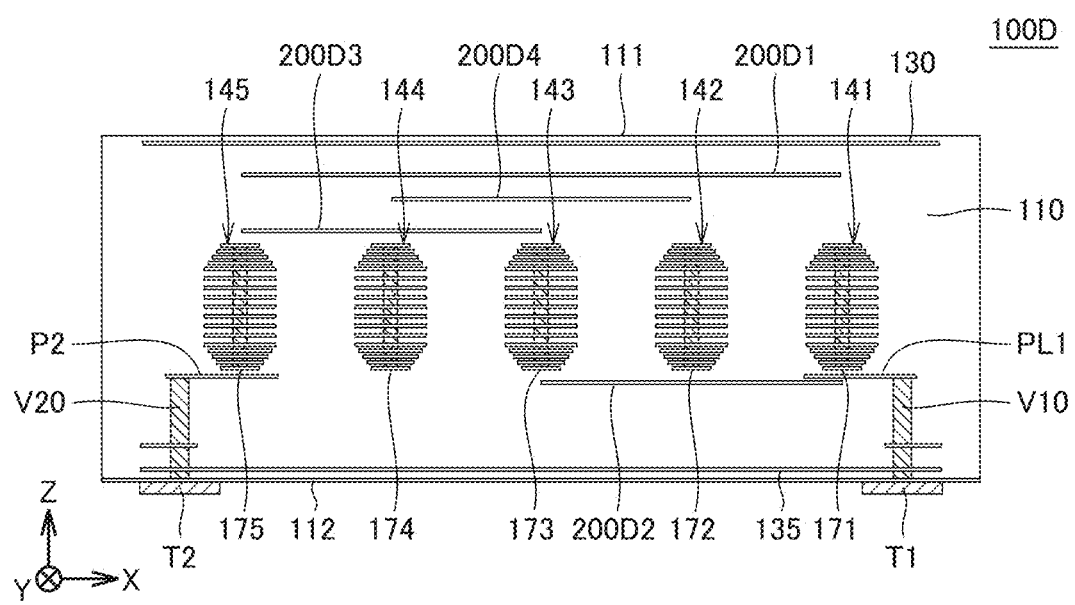
FIG. 9 is a cross-sectional view of a filter device according to Variation 4 of a preferred embodiment of the present invention.

FIG. 8 is a see-through perspective view showing an internal structure of a filter device 100D according to Variation 4. FIG. 9 is a cross-sectional view of the filter device 100D according to Variation 4. FIG. 9 is a cross-sectional view of the filter device 100D as viewed in Y-axis direction. Referring to FIGS. 8 and 9, the filter device 100D includes a capacitive electrode 200D1 to couple a resonator 141 and a resonator 145, and capacitive electrodes 200D2, 200D3, and 200D4 to couple other resonators.

The capacitive electrodes 200D1 through 200D4 according to Variation 4 are plate electrodes extending in X-axis direction, as with the capacitive electrode 200 according to the preferred embodiment described above. As described above, the capacitive electrode 200D1 couples the resonator 141 and the resonator 145. The capacitive electrode 200D2 couples the resonator 141 and the resonator 143. The capacitive electrode 200D3 couples the resonator 143 and the resonator 145. The capacitive electrode 200D4 couples the resonator 142 and the resonator 144.

In the example of the filter device 100D, the capacitive electrodes 200D1, 200D3, and 200D4 are disposed closer to the upper surface 111 side than the resonators, and the capacitive electrode 200D2 are disposed closer to the lower surface 112 side than the resonators. The arrangement of the capacitive electrodes are determined, as appropriate, based on a required extent of coupling of resonators, the balance of the capacitive coupling or the inductive coupling in the coupling of the resonators, and/or constraints on the layout with other elements, etc.

Figure 10:
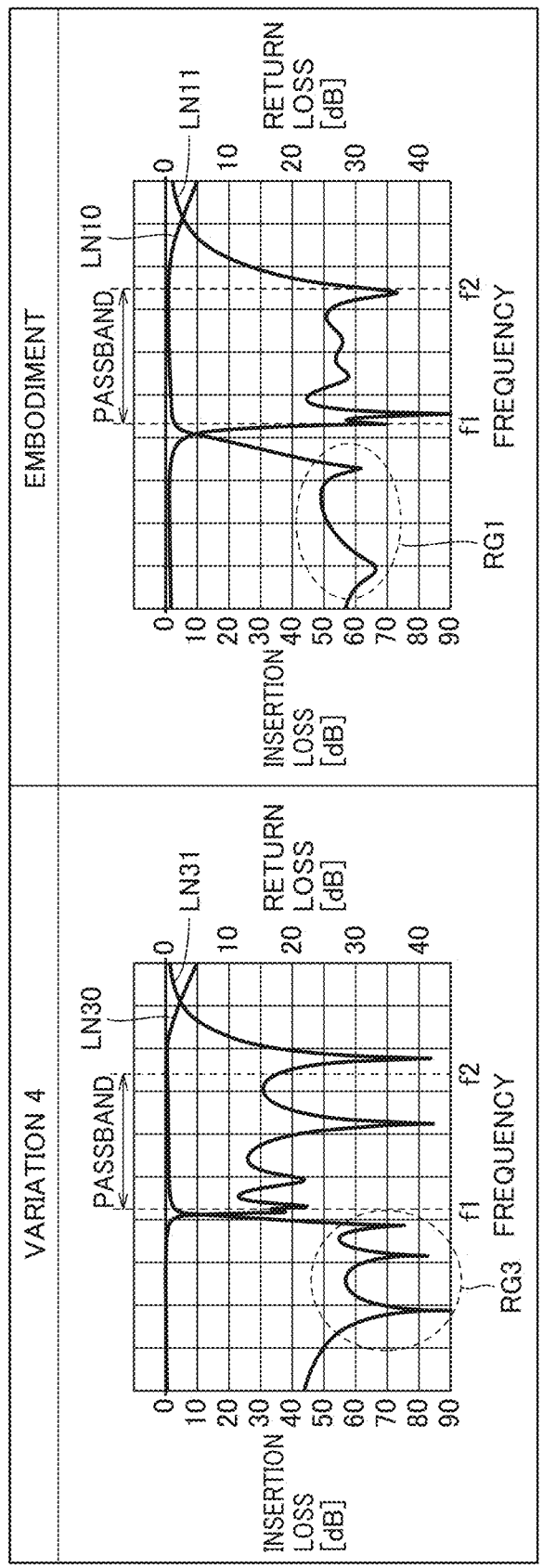
FIG. 10 is a diagram for illustrating bandpass characteristics of the filter device according to Variation 4.

FIG. 10 is a diagram for illustrating bandpass characteristics of the filter device 100D of FIG. 8. FIG. 10 illustrates the bandpass characteristics of the filter device 100 described with respect to FIG. 4, and bandpass characteristics of the filter device 100D according to Variation 4. In the graph for Variation 4, the insertion loss is indicated by a line LN30, and the return loss is indicated by a line LN31.

Referring to FIG. 10, in the filter device 100, two attenuation poles are present in a region RG1 closer to the lower-frequency side than the passband, and the attenuations of the respective attenuation poles are in a range from about 60 db to about 65 dB, for example. In contrast, in the filter device 100D according to Variation 4, three attenuation poles are present in a region RG3 closer to the lower-frequency side than the passband, achieving the attenuation greater than about 70 dB, for example, at the respective attenuation poles. Moreover, in the filter device 100D according to Variation 4, the attenuation poles are produced at frequencies closer to the passband than the filter device 100, thus providing steeper attenuation characteristics.

As described above, the filter device 100D according to Variation 4 includes the capacitive electrodes 200D1 through 200D4, thus allowing finer adjustment of the individual extents of cross-coupling between the resonator 141 and the resonator 145, between the resonator 141 and the resonator 143, between the resonator 143 and the resonator 145, and between the resonator 142 and the resonator 144. Accordingly, improvement in attenuation characteristics is possible.

The "capacitive electrodes 200D1, 200D2, 200D3, and 200D4" according to Variation 4 correspond to a "first capacitive electrode," a "second capacitive electrode," a "third capacitive electrode," and a "fourth capacitive electrode," respectively, according to the present disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A dielectric filter, comprising:
    a laminate body including a plurality of dielectric layers and having a cuboid or a substantially cuboid shape, a first plate electrode and a second plate electrode within the laminate body and spaced apart from each other in a lamination direction;
    a first resonator, a second resonator, and a third resonator between the first plate electrode and the second plate electrode and extending in a first direction orthogonal or substantially orthogonal to the lamination direction;
    a first shield conductor and a second shield conductor, on a first side surface and a second side, respectively, orthogonal or substantially orthogonal to the first direction surface and connected to the first plate electrode and the second plate electrode; and
    a first capacitive electrode coupling the first resonator and the third resonator; wherein
    the first resonator, the second resonator, and the third resonator are provided within the laminate body and aligned in a second direction orthogonal or substantially orthogonal to the lamination direction and the first direction in order of the first resonator, the second resonator, and the third resonator; and
    the first resonator, the second resonator, and the third resonator each include a first end connected to the first shield conductor and a second end spaced apart from the second shield conductor.

2. The dielectric filter according to claim 1, wherein the first capacitive electrode includes:
    a first portion opposed to the first resonator in the lamination direction and extending in the first direction;
    a second portion opposed to the third resonator in the lamination direction and extending in the first direction; and
    a third portion connecting the first portion and the second portion.

3. The dielectric filter according to claim 2, wherein the first capacitive electrode further includes:
    a first via electrode connecting the first portion and the third portion; and
    a second via electrode connecting the second portion and the third portion.

4. The dielectric filter according to claim 1, wherein the first capacitive electrode includes:
    a fourth portion opposed to the second end of the first resonator in the first direction;
    a fifth portion disposed opposed to the second end of the third resonator in the first direction; and
    a sixth portion connecting the fourth portion and the fifth portion.

5. The dielectric filter according to claim 1, further comprising:
    a fourth resonator between the first resonator and the second resonator in the second direction;
    a fifth resonator between the second resonator and the third resonator in the second direction;
    a second capacitive electrode capacitively coupling the first resonator and the second resonator;
    a third capacitive electrode capacitively coupling the second resonator and the third resonator; and
    a fourth capacitive electrode capacitively coupling the fourth resonator and the fifth resonator.

6. The dielectric filter according to claim 1, wherein each resonator includes a plurality of electrodes provided along the lamination direction.

7. The dielectric filter according to claim 1, wherein each of the plurality of dielectric layers includes low temperature co-fired ceramics or resin.

8. The dielectric filter according to claim 3, wherein each of the first and second via electrodes is defined by a conductive paste, plating, or a metal pin.

9. The dielectric filter according to claim 1, wherein each of the first and second shield conductors has a C shape or a substantially C shape.

10. The dielectric filter according to claim 1, wherein each of the first and second shield conductors defines and functions as a ground terminal.

11. A communication device, comprising:
    a radio front-end circuit including a dielectric filter according to claim 1.

12. The communication device according to claim 11, wherein the first capacitive electrode includes:
    a first portion opposed to the first resonator in the lamination direction and extending in the first direction;
    a second portion opposed to the third resonator in the lamination direction and extending in the first direction; and
    a third portion connecting the first portion and the second portion.

13. The communication device according to claim 12, wherein the first capacitive electrode further includes:
    a first via electrode connecting the first portion and the third portion; and
    a second via electrode connecting the second portion and the third portion.

14. The communication device according to claim 11, wherein the first capacitive electrode includes:
    a fourth portion opposed to the second end of the first resonator in the first direction;
    a fifth portion disposed opposed to the second end of the third resonator in the first direction; and
    a sixth portion connecting the fourth portion and the fifth portion.

15. The communication device according to claim 11, further comprising:
    a fourth resonator between the first resonator and the second resonator in the second direction;
    a fifth resonator between the second resonator and the third resonator in the second direction;
    a second capacitive electrode capacitively coupling the first resonator and the second resonator;
    a third capacitive electrode capacitively coupling the second resonator and the third resonator; and
    a fourth capacitive electrode capacitively coupling the fourth resonator and the fifth resonator.

16. The communication device according to claim 11, wherein each resonator includes a plurality of electrodes provided along the lamination direction.

17. The communication device according to claim 11, wherein each of the plurality of dielectric layers includes low temperature co-fired ceramics or resin.

18. The communication device according to claim 13, wherein each of the first and second via electrodes is defined by a conductive paste, plating, or a metal pin.

19. The communication device according to claim 11, wherein each of the first and second shield conductors has a C shape or a substantially C shape.

20. The communication device according to claim 11, wherein each of the first and second shield conductors defines and functions as a ground terminal.

* * * * *